(12) United States Patent
Liao et al.

(10) Patent No.: US 12,045,103 B2
(45) Date of Patent: Jul. 23, 2024

(54) HEAT DISSIPATION STRUCTURE

(71) Applicant: CLEVO CO., New Taipei (TW)

(72) Inventors: Wei-Cheng Liao, New Taipei (TW);
Bo-Xuan Chen, New Taipei (TW);
Guan-You Chen, Taipei (TW)

(73) Assignee: CLEVO CO., New Taipei (TW)

( * ) Notice: Subject to any disclaimer, the term of this patent is extended or adjusted under 35 U.S.C. 154(b) by 26 days.

(21) Appl. No.: 18/114,311

(22) Filed: Feb. 27, 2023

(65) Prior Publication Data

US 2023/0280805 A1    Sep. 7, 2023

(30) Foreign Application Priority Data

Mar. 4, 2022  (TW) ................................ 111202151

(51) Int. Cl.
| | |
|---|---|
| G06F 1/16 | (2006.01) |
| G06F 1/20 | (2006.01) |
| H05K 5/00 | (2006.01) |
| H05K 7/00 | (2006.01) |
| H05K 7/20 | (2006.01) |

(52) U.S. Cl.
CPC ........... G06F 1/203 (2013.01); H05K 7/2029 (2013.01)

(58) Field of Classification Search
CPC ............ G06F 1/203; G06F 1/206; G06F 1/20; H05K 7/2029; H05K 7/20336; H05K 7/20381; H05K 7/20309; H05K 7/20318; H05K 7/20327
See application file for complete search history.

(56) References Cited

U.S. PATENT DOCUMENTS

| | | | | |
|---|---|---|---|---|
| 2012/0168130 A1* | 7/2012 | Li | ......................... | F28D 15/0266 |
| | | | | 165/185 |
| 2016/0227678 A1* | 8/2016 | Park | ................... | H05K 7/20963 |
| 2018/0156968 A1* | 6/2018 | Yoo | .......................... | G02B 6/009 |
| 2020/0393612 A1* | 12/2020 | Ma | .......................... | G02F 1/1336 |
| 2022/0087067 A1* | 3/2022 | Jia | .......................... | H05K 5/0086 |
| 2023/0102931 A1* | 3/2023 | Lee | ..................... | H05K 7/20336 |
| | | | | 361/700 |
| 2023/0195171 A1* | 6/2023 | Seo | ..................... | H05K 7/20445 |
| | | | | 361/748 |
| 2023/0255113 A1* | 8/2023 | Lee | ......................... | H10N 10/17 |
| | | | | 136/205 |
| 2023/0259183 A1* | 8/2023 | Hsu | ....................... | H05K 7/1407 |
| | | | | 361/679.47 |
| 2023/0284421 A1* | 9/2023 | Malouin | ............. | H01L 23/4735 |
| 2023/0380111 A1* | 11/2023 | Lee | ........................... | H05K 5/03 |

* cited by examiner

*Primary Examiner* — Anthony M Haughton
(74) *Attorney, Agent, or Firm* — Li & Cai Intellectual Property (USA) Office

(57) ABSTRACT

A heat dissipation structure includes a heat dissipation member and a fixed member. The fixed member has a first surface and a second surface oppositely. The heat dissipation member is disposed on the first surface, and one part of the second surface corresponds to one side of at least one heat generating source and is disposed adjacent to the one side of the heat generating source. The first surface has a first zone surrounded by a second zone. The heat dissipation member is disposed on the first zone corresponding to the heat generating source. The second zone has at least one groove arranged around one part of the first zone. A distance between one side of the groove adjacent to the first zone and the first zone is less than 1.0 mm, and a volume ratio of the groove to the heat dissipation member is 0.9 to 1.6.

10 Claims, 6 Drawing Sheets

HEAT DISSIPATION STRUCTURE

CROSS-REFERENCE TO RELATED PATENT APPLICATION

This application claims the benefit of priority to Taiwan Patent Application No. 111202151, filed on Mar. 4, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a heat dissipation structure, and more particularly to a heat dissipation structure that can prevent liquid metal from spilling out after a phase change.

BACKGROUND OF THE DISCLOSURE

In the conventional technology, when liquid metal is used a material of heat dissipation interface, in order to prevent the liquid metal from spilling out to come into contact with other electronic components, a silicon-based paste material is often applied around a heat generating source, such as CPU and GPU, to prevent the liquid metal from spilling out, or the electronic components around the heat generating source are cured by a dispensing process to prevent short circuits. However, the aforementioned method is time-consuming and labor-intensive in the productive process, and fixation of a dispensing equipment is required, resulting in increased costs and working hours.

Therefore, how to improve a structural design of a heat dissipation structure so as to overcome the above issues, has become one of the important issues to be addressed in the related field.

SUMMARY OF THE DISCLOSURE

In response to the above-referenced technical inadequacies, the present disclosure provides a heat dissipation structure.

In order to solve the above-mentioned problems, one of the technical aspects adopted by the present disclosure is to provide a heat dissipation which includes a heat dissipation member and a fixed member. The fixed member has a first surface and a second surface that are opposite to each other. The heat dissipation member is disposed on the first surface, and at least one part of the second surface corresponds to one side of at least one heat generating source and is disposed adjacent to the one side of the at least one heat generating source. The first surface has a first zone and a second zone, and the second zone surrounds the first zone. The heat dissipation member is disposed on the first zone, and the first zone corresponds to the at least one heat generating source. The second zone has at least one groove, and the at least one groove is arranged around at least one part of the first zone. A distance between one side of the at least one groove that is adjacent to the first zone and the first zone is less than 1.0 mm, and a ratio of a volume of the at least one groove to a volume of the heat dissipation member is 0.9 to 1.6.

In one of the possible or preferred embodiments, the heat dissipation member is formed by liquid metal.

In one of the possible or preferred embodiments, a quantity of the at least one groove is one, and the groove is in a shape of a ring so as to completely surround the first zone.

In one of the possible or preferred embodiments, the first zone is rectangular, square, circular, triangular, or polygonal.

In one of the possible or preferred embodiments, the first zone is rectangular. The quantity of the at least one groove is four, and each of the four grooves is L shaped. The four grooves respectively corresponds to four corners of the first zone and arranged around the at least one part of the first zone.

In one of the possible or preferred embodiments, the first zone is rectangular. The quantity of the at least one groove is four, and each of the four grooves is straight. The four grooves respectively correspond to four sides of the first zone, and each of the four grooves is arranged around at least one part of the first zone.

In one of the possible or preferred embodiments, the second zone further has at least one projection. The at least one projection is arranged adjacent to another side of the at least one groove that is away from the first zone. The at least one projection has a height with respect to a surface of the second zone, and the height of the at least one projection is 0.1 mm to 0.5 mm.

In one of the possible or preferred embodiments, the quantity of the at least one groove is multiple. Each of the multiple grooves is in the shape of a ring, and the multiple grooves are arranged completely around each other.

In one of the possible or preferred embodiments, the second zone further has at least one projection. The at least one projection is arranged adjacent to the another side of the groove farthest away from the first zone that is away from the first zone. The at least one projection has a height with respect to a surface of the second zone, and the height of the at least one projection is 0.1 mm to 0.5 mm.

In one of the possible or preferred embodiments, the at least one heat generating source is a central processing unit (CPU), a graphics processing unit (GPU), a microcontroller (MCU), a microprocessor (MPU), or an application specific integrated circuit (ASIC).

Therefore, in the heat dissipation structure provided by the present disclosure, by virtue of "the fixed member having the first surface and the second surface that are opposite to each other, the heat dissipation member being disposed on the first surface, and at least one part of the second surface corresponding to the one side of at least one heat generating source and being disposed adjacent to the one side of the at least one heat generating source," "the first surface having the first zone and the second zone, the second zone surrounding the first zone, the heat dissipation member being disposed on the first zone, and the first zone corresponding to the at least one heat generating source," "the second zone having the at least one groove, and the at least one groove being arranged around at least one part of the first zone," and "the distance between the one side of the at least one groove that is adjacent to the first zone and the first zone being less than 1.0 mm, and the ratio of the volume of the at least one groove to the volume of the heat dissipation member being 0.9 to 1.6," a design of the heat dissipation structure can be simplified, so that a cost increase caused by additional equipment in a production line can be reduced and an assembly time in the production line can be shortened. Therefore, a flexibility of using the heat dissipation module can be improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
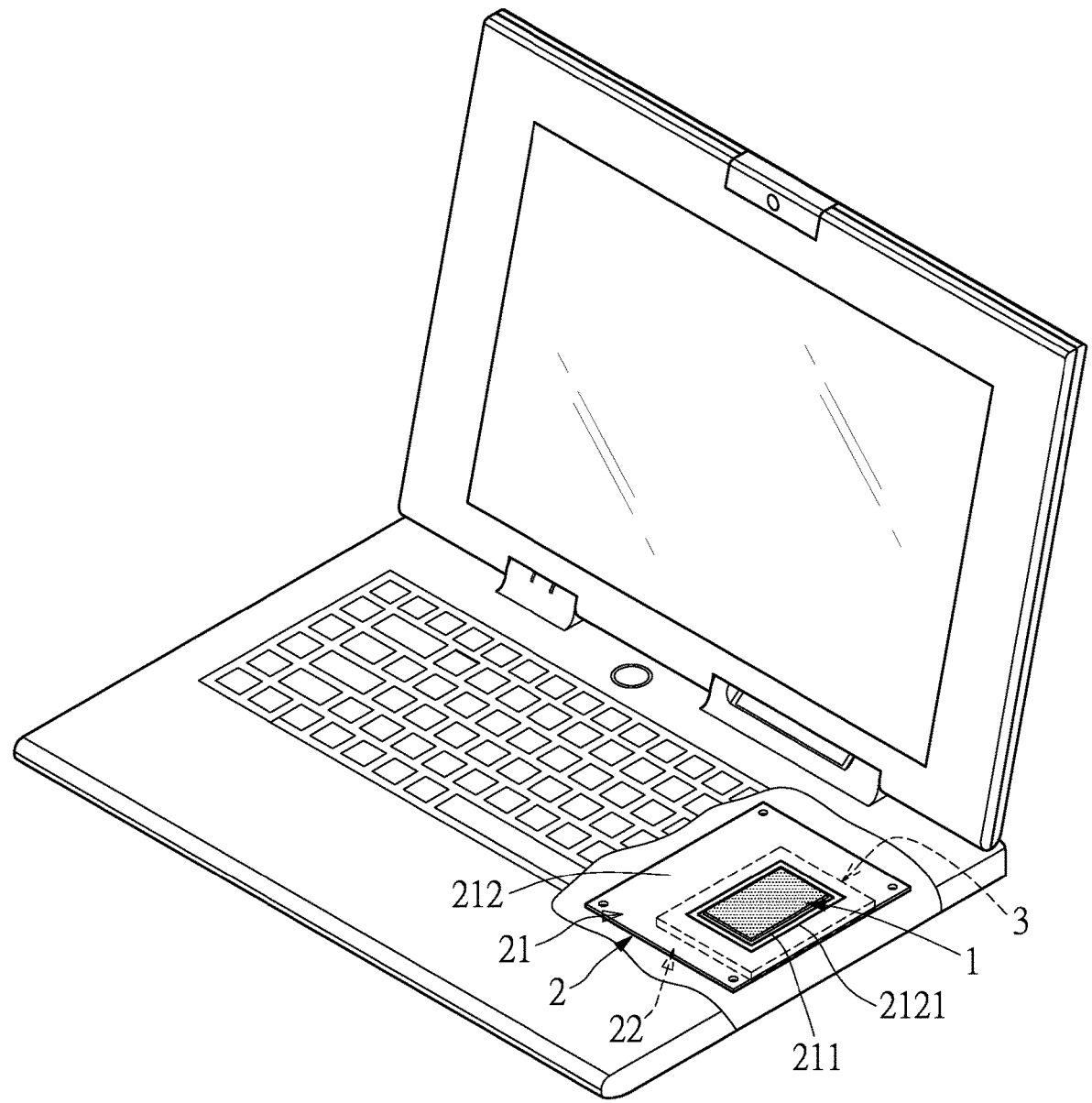
FIG. 1 is a schematic view of a heat dissipation structure in use according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
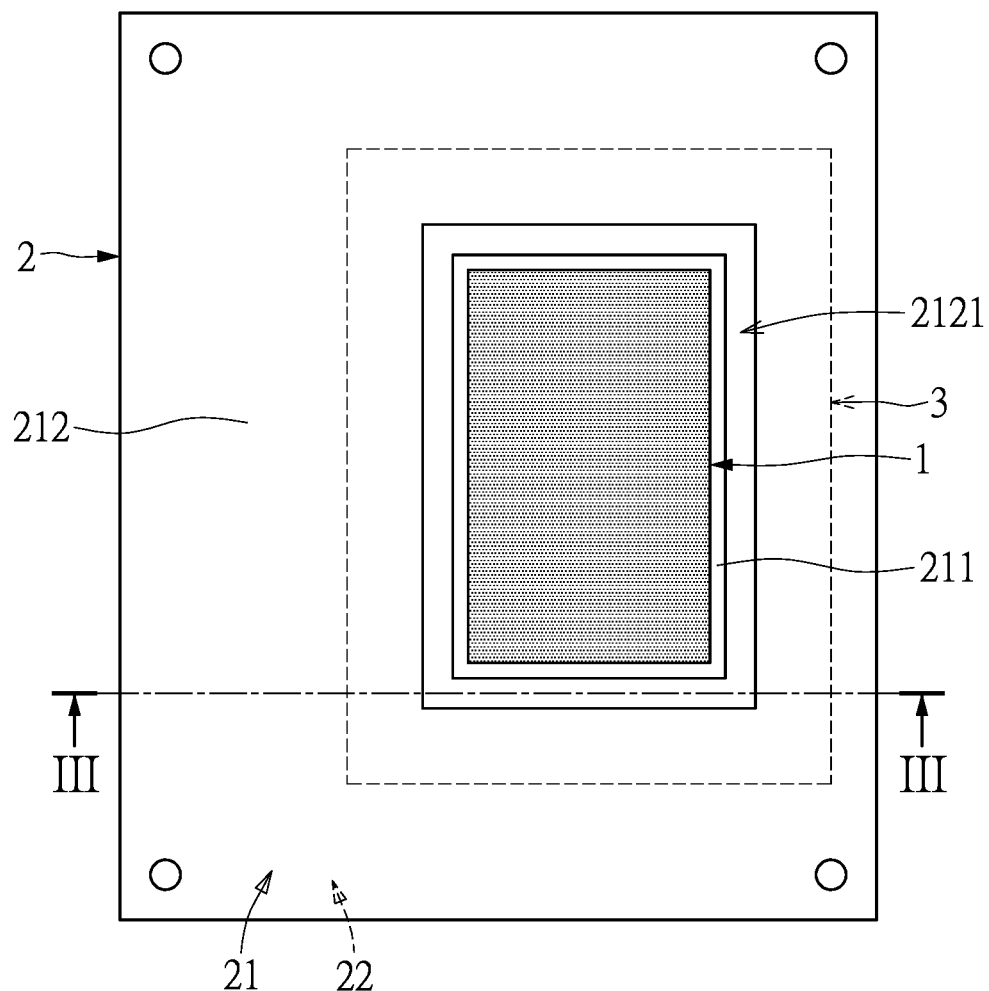
FIG. 2 is a schematic top view of a heat dissipation structure according to a first embodiment of the present disclosure.
Figure 3:
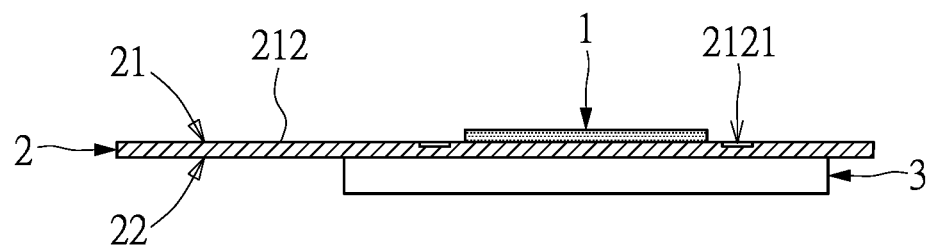
FIG. 3 is a schematic cross-sectional view taken along line III-III of FIG. 2.

Referring to FIG. 1 to FIG. 3, a first embodiment of the present disclosure provides a heat dissipation structure S, which includes a heat dissipation member 1 and a fixed member 2.

As shown in FIG. 1, the heat dissipation structure S of the present disclosure can be applied to an electronic device with a heat generating source, such as a desktop computer, a laptop computer, a tablet, and a mobile phone, but the present disclosure is not limited thereto.

The fixed member 2 has a first surface 21 and a second surface that are opposite to each other. For example, the first surface 21 and the second surface 22 can respectively be an upper surface and a lower surface of the fixed member 2, but the present disclosure is not limited thereto. The heat dissipation member 1 is disposed on a position of the first surface 21 of the fixed member 2 corresponding to at least one heat generating source 3, and the second surface 22 of the fixed member 2 faces the at least one heat generating source 3 and is disposed near the at least one heat generating source 3.

The heat dissipation member 1 can include a heat dissipation material having a high heat dissipation coefficient, and the heat dissipation member 1 can have a first state and a second state. For example, the first state can be a solid state and the second state can be a liquid state, but the present disclosure is not limited thereto. In one particular embodiment, the heat dissipation member 1 can be formed by liquid metal, such as tin, gallium, and indium. In addition, the heat dissipation member 1 can be rectangular, square, round, triangular, polygonal, etc., but the present disclosure is not limited thereto.

The fixed member 2 can be made of metal or non-metal having the high heat dissipation coefficient. In one particular embodiment, the fixed member 2 is metal having the high heat dissipation coefficient, such as, but not limited to, copper, copper alloy, aluminum, aluminum alloy, gold, gold alloy, silver, and silver alloy. On the other hand, a shape, a size, and a thickness of the fixed member 2 can be adjusted according to user's demands or practical requirements, as long as at least one part of the second surface 22 can fully correspond to one side of the at least one heat generating source 3. In one particular embodiment, the at least one part of the second surface 22 of the fixed member 2 corresponds to the one side of the at least one heat generating source 3 and is adjacent to the one side of the at least one heat generating source 3. Furthermore, the at least one part of the second surface 22 of the fixed member 22 can be in contact with the one side of the at least one heat generating source 3.

As shown in FIG. 2 and FIG. 3, the first surface 21 of the fixed member 2 has a first zone 211 and a second zone 212. The second zone 212 surrounds the first zone 211, and the heat dissipation member 1 is disposed on the first zone 211. That is, the first zone 211 corresponds to the at least one heat generating source 3 so that the heat dissipation member 1 can dissipate heat more quickly and efficiently. A surface of the first zone 211 can protrude outward or be recessed inward to allow the heat dissipation member 1 to be disposed more easily, but the present disclosure is not limited thereto. In addition, the first zone 211 can be, but not limited to, rectangular, square, round, triangular, polygonal, etc., as long as the first zone 211 can correspond to the heat dissipation member 1 and allow the heat dissipation member to be disposed therein. The second zone 212 has at least one groove 2121, and the at least one groove 2121 is arranged around at least one part of the first zone 211. Further, a shape of the groove 2121 can be adjusted according to the user's demands or the practical requirements. The groove 2121 can be formed in the second zone 212 of the first surface 21 of the fixed member 2 by cold forging, hot forging, stamping, or a computer numerical control (CNC) process.

In the present embodiment as shown in FIG. 2 and FIG. 3, a quantity of the groove 2121 is one, and the groove 2121 is arranged completely around the first zone 211. That is, the groove 2121 is in the shape of a ring. In addition, in one embodiment, when a volume of the heat dissipation member 1 is 55 mm$^3$ (i.e., 22 mm×25 mm×0.1 mm), a distance between one side of the groove 2121 that is adjacent to the first zone 211 and the first zone 211 is less than 1.0 mm, so as to prevent the heat dissipation member 1 from directly spilling to an area outside the groove 2121 when the heat dissipation member 1 changes from the first state to the second state (e.g., from the solid state to the liquid state). Further, the volume of the groove 2121 is 86.5 mm$^3$. That is, a ratio of the volume of the groove 2121 to the volume of the heat dissipation member 1 is at least 1.57, so that a change of state resulting from the change of the heat dissipation member 1 from the first state to the second state (e.g., from the solid state to the liquid state) can be accommodated in the groove 2121.

The heat generating source 3 can be disposed on a carrier substrate, and the heat generating source 3 can be a central processing unit (CPU), a graphics processing unit (GPU), a microcontroller (MCU), a microprocessor (MPU), an application specific integrated circuit (ASIC), or other electronic components, but the present disclosure is not limited thereto. Further, the heat generating source 3 can also be a heat-conducting metal block, a heat-conducting alloy block, a vapor chamber, or a heat dissipation end of a heat pipe.

Second Embodiment

Figure 4:
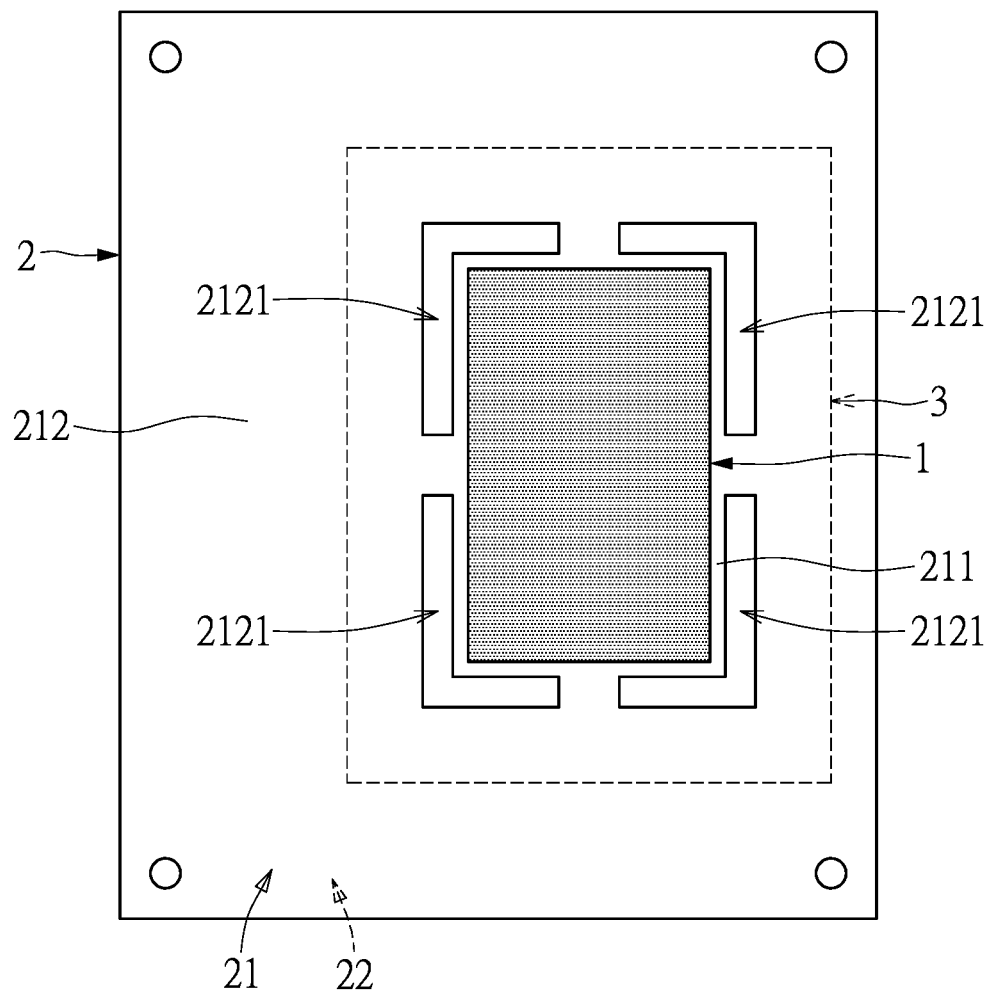
FIG. 4 is a schematic top view of a heat dissipation structure according to a second embodiment of the present disclosure.

Referring to FIG. 4, FIG. 4 is a schematic top view of a heat dissipation structure S according to a second embodiment of the present disclosure. The difference between the second embodiment and the first embodiment is the quantity of the groove 2121. In addition, it should be noted that other configurations of the heat dissipation structure S of the second embodiment are similar to those of the first embodiment described above, and will not be iterated herein.

In the present embodiment, the first zone 211 is rectangular, and the quantity of the grooves 2121 is four. The four grooves 2121 respectively correspond to four corners of the first zone 211, and each of the four grooves 2121 is arranged around at least one part of the first zone 211. In addition, each of the four grooves 2121 is L shaped. In one embodiment, when the volume of the heat dissipation member 1 is 55 mm$^3$ (i.e., 22 mm×25 mm×0.1 mm), the distance between one side of each of the four grooves 2121 that is adjacent to the first zone 211 and the first zone 211 is less than 1.0 mm, so as to prevent the heat dissipation member 1 from directly spilling to the area outside the four grooves 2121 when the heat dissipation member 1 changes from the first state to the second state (e.g., from the solid state to the liquid state). Further, a total volume of the four grooves 2121 is 74.5 mm$^3$. That is, the ratio of the total volume of the four grooves 2121 to the volume of the heat dissipation member 1 is at least 1.35, so that the change of state resulting from the change of the heat dissipation member 1 from the first state to the second state (e.g., from the solid state to the liquid state) can be correspondingly accommodated in the four grooves 2121.

Third Embodiment

Figure 5:
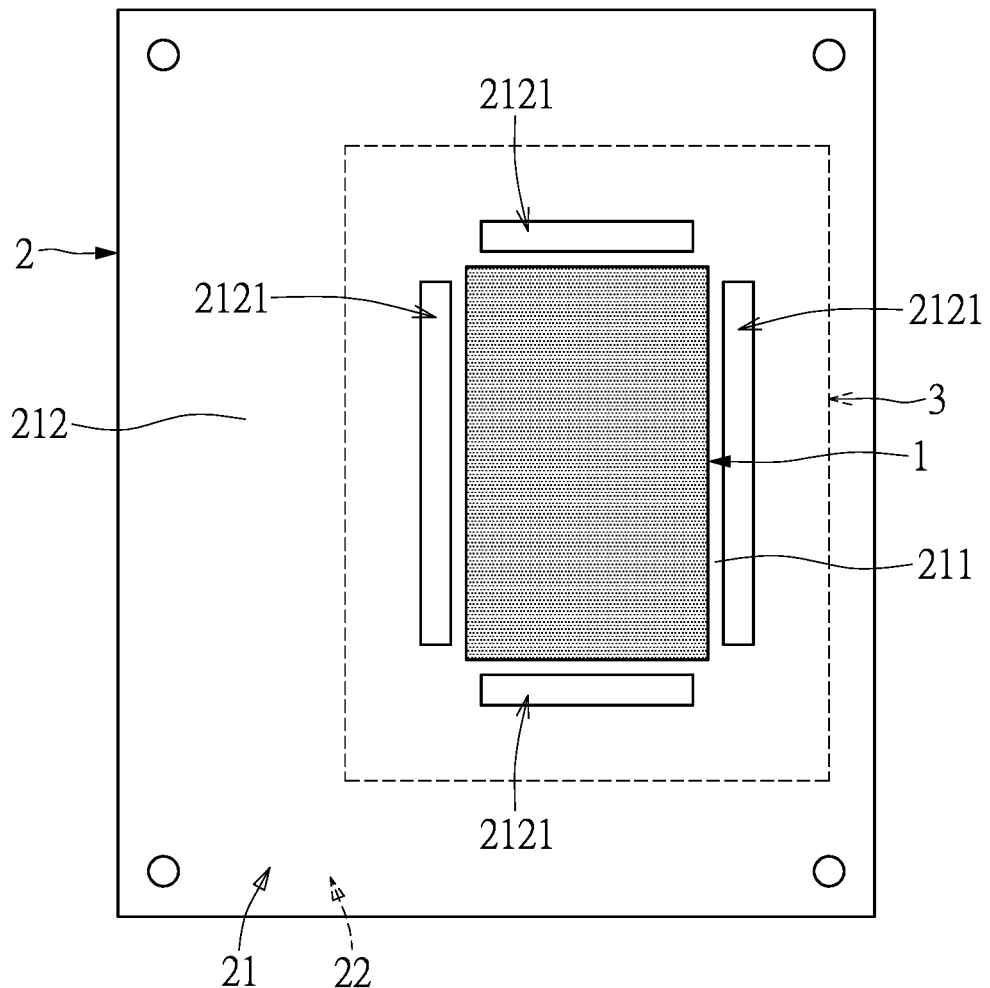
FIG. 5 is a schematic top view of a heat dissipation structure according to a third embodiment of the present disclosure.

Referring to FIG. 5, FIG. 5 is a schematic top view of a heat dissipation structure S according to a third embodiment of the present disclosure. The difference between the third embodiment and the second embodiment is the shape of the groove 2121. In addition, it should be noted that other configurations of the heat dissipation structure S of the third embodiment are similar to those of the first embodiment and the second embodiment described above, and will not be iterated herein.

In the present embodiment, the first zone 211 is rectangular, and the quantity of the grooves 2121 is four. The four grooves 2121 respectively correspond to four sides of the first zone 211, and each of the four grooves 2121 is arranged around at least one part of the first zone 211. In addition, each of the four grooves 2121 is straight. In one embodiment, when the volume of the heat dissipation member 1 is 55 mm$^3$ (i.e., 22 mm×25 mm×0.1 mm), the distance between one side of each of the four grooves 2121 that is adjacent to the first zone 211 and the first zone 211 is less than 1.0 mm, so as to prevent the heat dissipation member 1 from directly spilling to the area outside the four grooves 2121 when the heat dissipation member 1 changes from the first state to the second state (e.g., from the solid state to the liquid state). Further, a total volume of the four grooves 2121 is 64.0 mm$^3$. That is, the ratio of the total volume of the four grooves 2121 to the volume of the heat dissipation member 1 is at least 1.16, so that the change of state resulting from the change of the heat dissipation member 1 from the first state to the second state (e.g., from the solid state to the liquid state) can be correspondingly accommodated in the four grooves 2121.

Fourth Embodiment

Figure 6:
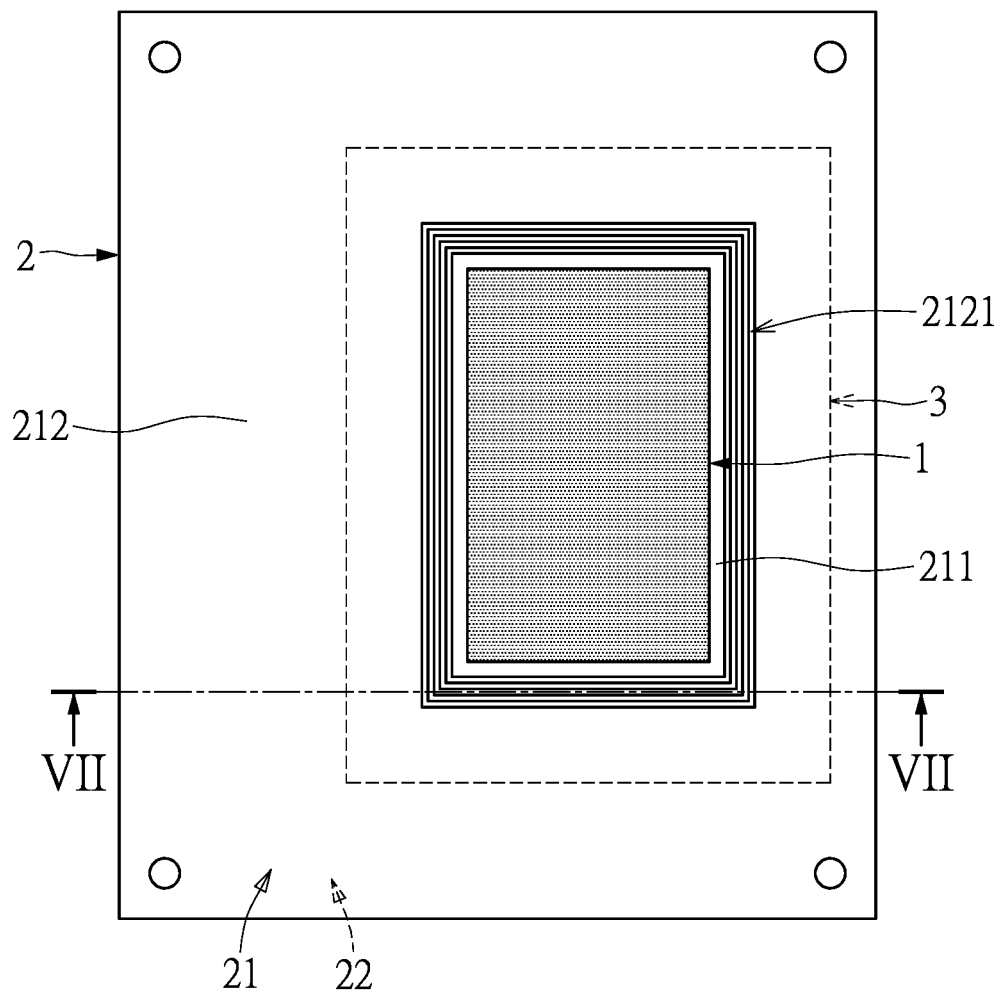
FIG. 6 is a schematic top view of a heat dissipation structure according to a fourth embodiment of the present disclosure.

Referring to FIG. 6, FIG. 6 is a schematic top view of a heat dissipation structure S according to a four embodiment of the present disclosure. The difference between the fourth embodiment and the first embodiment is the quantity of the groove 2121. In addition, it should be noted that other configurations of the heat dissipation structure S of the fourth embodiment are similar to those of the first embodiment, the second embodiment, and the third embodiment described above, and will not be iterated herein.

In the present embodiment, the first zone 211 is rectangular, and the quantity of the grooves 2121 is multiple. Each of the multiple grooves 2121 is arranged completely around the first zone 211. That is, each of the multiple grooves 2121 is in the shape of the ring, and the multiple grooves 2121 are arranged completely around each other. In addition, the quantity of the grooves 2121 can be two, three, four, five, or more, and can be adjusted according to the user's demands and the practical requirements. However, the present disclosure is not limited thereto. In one embodiment, when the volume of the heat dissipation member 1 is 55 mm$^3$ (i.e., 22 mm×25 mm×0.1 mm), the distance between one side of each of the multiple grooves 2121 that is adjacent to the first zone 211 and the first zone 211 is less than 1.0 mm, so as to prevent the heat dissipation member 1 from directly spilling to the area outside the multiple grooves 2121 when the heat dissipation member 1 changes from the first state to the second state (e.g., from the solid state to the liquid state). Further, a total volume of the multiple grooves 2121 is 51.85 mm$^3$. That is, the ratio of the total volume of the multiple grooves 2121 to the volume of the heat dissipation member 1 is at least 0.94, so that the change of state resulting from the change of the heat dissipation member 1 from the first state to the second state (e.g., from the solid state to the liquid state) can be correspondingly accommodated in the multiple grooves 2121.

Fifth Embodiment

Figure 7:
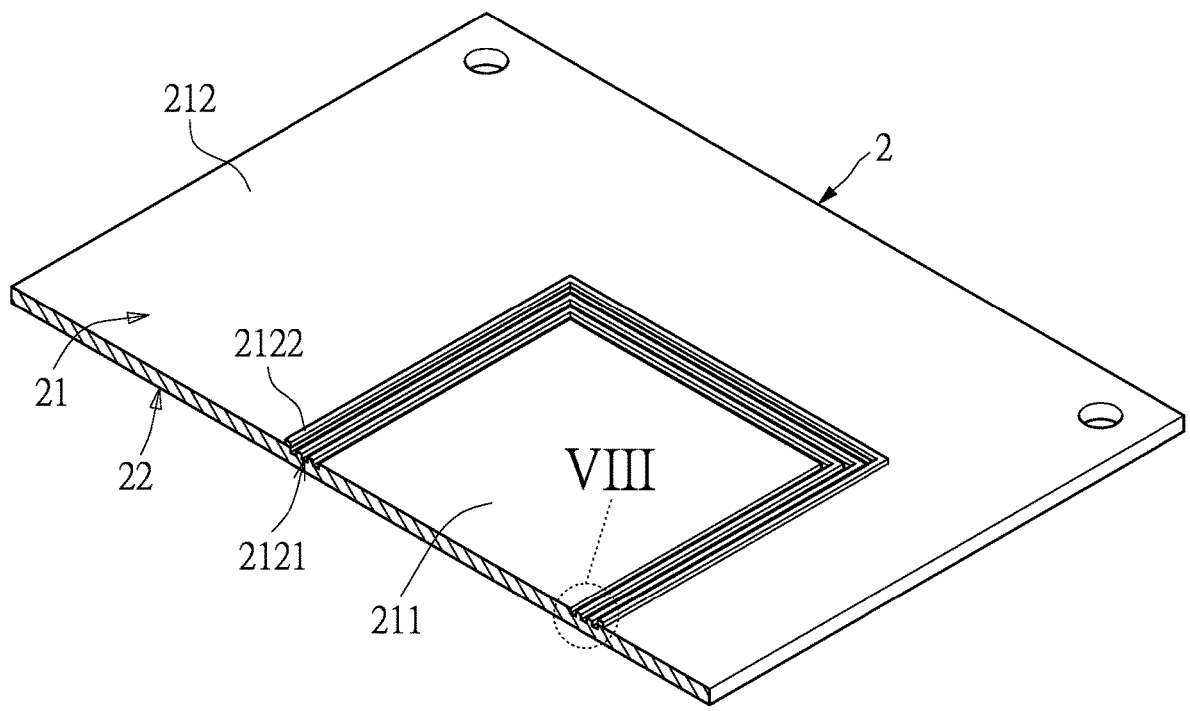
FIG. 7 is a schematic partial view of a heat dissipation structure according to a fifth embodiment of the present disclosure.
Figure 8:
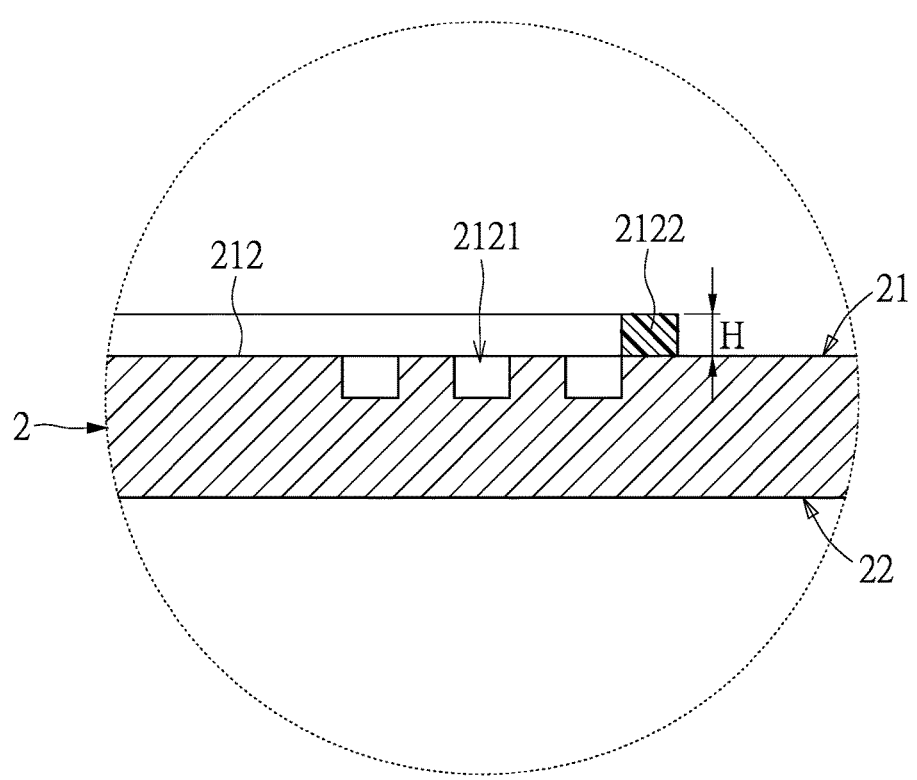
FIG. 8 is a schematic cross-sectional view taken along line VIII-VIII of FIG. 7.

Referring to FIG. 7 and FIG. 8, FIG. 7 and FIG. 8 are schematic views of a heat dissipation structure S according to a four embodiment of the present disclosure. The difference between the fifth embodiment and the first embodiment is a projection. In addition, it should be noted that other configurations of the heat dissipation structure S of the fifth embodiment are similar to those of the first embodiment, the second embodiment, the third embodiment, and the fourth embodiment described above, and will not be iterated herein.

In the present embodiment, the second zone 212 also has at least one projection 2122. The projection 2122 projects from a surface of the second zone 212, and the projection 2122 has a height H with respect to the surface of the second zone 212. The height H can be 0.1 mm to 0.5 mm. For example, the height H can be 0.1 mm, 0.15 mm, 0.2 mm, 0.25 mm, 0.3 mm, 0.35 mm, 0.4 mm, 0.45 mm, or 0.5 mm. In one particular embodiment, the height H is 0.2 mm. In addition, the projection can be made of a polyester film (mylar), metal, plastic, or acrylic, but the present disclosure is not limited thereto. Further, the projection 2122 is arranged adjacent to another side of the groove 2121 that is away from the first zone 211 and corresponds to at least one part of the another side of the groove 2121 that is away from the first zone 211. In one particular embodiment, the projection 2122 corresponds to all of the another side of the groove 2121 that is away from the first zone 211, so as to prevent the heat dissipation member 1 from directly spilling to the area outside the groove 2121 when the heat dissipation member 1 changes from the first state to the second state (e.g., from the solid state to the liquid state). In one embodiment as shown in FIG. 7 and FIG. 8, when the quantity of the grooves is multiple, the multiple grooves 2121 are arranged completely around the first zone 211 and the multiple grooves 2121 are arranged completely around each other. In addition, the projection 2122 is arranged adjacent to the another side of the groove 2121 farthest away from the first zone 211 that is away from the first zone 211. That is, the projection 2122 is arranged adjacent to an outer side of the groove 2121 farthest away from the first zone 211. By providing the projection 2122, the effect of preventing the heat dissipation member 1 from directly spilling to the area outside the groove 2121 when the heat dissipation member 1 changes from the first state to the second state (e.g., from the solid state to the liquid state) can be improved.

Beneficial Effects of the Embodiments

In conclusion, one of the beneficial effects of the present disclosure is that, in the heat dissipation structure S provided by the present disclosure, by virtue of "the fixed member 2 having the first surface 21 and the second surface 22 that are opposite to each other, the heat dissipation member 1 being disposed on the first surface 21, and at least one part of the second surface 22 corresponding to the one side of at least one heat generating source 3 and being disposed adjacent to the one side of the at least one heat generating source 3," "the first surface 21 having the first zone 211 and the second zone 212, the second zone 212 surrounding the first zone 211, the heat dissipation member 1 being disposed on the first zone 211, and the first zone 211 corresponding to the at least one heat generating source 3," "the second zone 212 having the at least one groove 2121, and the at least one groove 2121 being arranged around at least one part of the first zone 211," and "the distance between the one side of the at least one groove 2121 that is adjacent to the first zone 211 and the first zone 211 being less than 1.0 mm, and the ratio of the volume of the at least one groove 2121 to the volume of the heat dissipation member 1 being 0.9 to 1.6," a design of the heat dissipation structure can be simplified, so that a cost increase caused by additional equipment in a production line can be reduced and an assembly time in the production line can be shortened. Therefore, a flexibility of using the heat dissipation module can be improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A heat dissipation structure, comprising:
    a heat dissipation member; and
    a fixed member, wherein the fixed member has a first surface and a second surface that are opposite to each other, the heat dissipation member is disposed on the first surface, and at least one part of the second surface corresponds to one side of at least one heat generating source and is disposed adjacent to the one side of the at least one heat generating source;
    wherein, the first surface has a first zone and a second zone, the second zone surrounds the first zone, the heat dissipation member is disposed on the first zone, and the first zone corresponds to the at least one heat generating source;
    wherein the second zone has at least one groove, and the at least one groove is arranged around at least one part of the first zone;
    wherein a distance between one side of the at least one groove that is adjacent to the first zone and the first zone is less than 1.0 mm, and a ratio of a volume of the at least one groove to a volume of the heat dissipation member is 0.9 to 1.6.

2. The heat dissipation structure according to claim 1, wherein the heat dissipation member is formed by liquid metal.

3. The heat dissipation structure according to claim 1, wherein a quantity of the at least one groove is one, and the groove is in a shape of a ring so as to completely surround the first zone.

4. The heat dissipation structure according to claim 1, wherein the first zone is rectangular, square, circular, triangular, or polygonal.

5. The heat dissipation structure according to claim 4, wherein the first zone is rectangular, a quantity of the at least one groove is four, and each of the four grooves is L shaped; wherein the four grooves respectively corresponds to four corners of the first zone and arranged around the at least one part of the first zone.

6. The heat dissipation structure according to claim 4, wherein the first zone is rectangular, a quantity of the at least one groove is four, and each of the four grooves is straight; wherein the four grooves respectively correspond to fours sides of the first zone, and each of the four grooves is arranged around at least one part of the first zone.

7. The heat dissipation structure according to claim 1, wherein the second zone further has at least one projection, and the at least one projection is arranged adjacent to another side of the at least one groove that is away from the first zone; wherein the at least one projection has a height with respect to a surface of the second zone, and the height of the at least one projection is 0.1 mm to 0.5 mm.

8. The heat dissipation structure according to claim 1, wherein a quantity of the at least one groove is multiple, each of the multiple grooves is in the shape of a ring, and the multiple grooves are arranged completely around each other.

9. The heat dissipation structure according to claim 8, wherein the second zone further has at least one projection, and the at least one projection is arranged adjacent to the another side of the groove farthest away from the first zone that is away from the first zone; wherein the at least one projection has a height with respect to a surface of the second zone, and the height of the at least one projection is 0.1 mm to 0.5 mm.

10. The heat dissipation structure according to claim 1, wherein the at least one heat generating source is a central processing unit (CPU), a graphics processing unit (GPU), a microcontroller (MCU), a microprocessor (MPU), or an application specific integrated circuit (ASIC).

* * * * *